(12) United States Patent
Kitahara et al.

(10) Patent No.: US 9,266,235 B2
(45) Date of Patent: Feb. 23, 2016

(54) INDUSTRIAL ROBOT WITH PROTRUDING SECOND DRIVE MOTOR

(75) Inventors: Yasuyuki Kitahara, Nagano (JP); Shigeyuki Kaino, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 492 days.

(21) Appl. No.: 13/634,665

(22) PCT Filed: Apr. 6, 2011

(86) PCT No.: PCT/JP2011/058674
§ 371 (c)(1),
(2), (4) Date: Sep. 13, 2012

(87) PCT Pub. No.: WO2011/135986
PCT Pub. Date: Nov. 3, 2011

(65) Prior Publication Data
US 2013/0036851 A1   Feb. 14, 2013

(30) Foreign Application Priority Data

Apr. 28, 2010   (JP) .................................. 2010-104066

(51) Int. Cl.
*B25J 9/04* (2006.01)
*H01L 21/677* (2006.01)

(52) U.S. Cl.
CPC ............ *B25J 9/042* (2013.01); *H01L 21/67766* (2013.01); *Y10T 74/20317* (2015.01); *Y10T 74/20323* (2015.01)

(58) Field of Classification Search
CPC ...................................... B25J 9/042
USPC ............................................ 414/744.1, 744.5
See application file for complete search history.

(56) References Cited

U.S. PATENT DOCUMENTS 5,634,377 A * 6/1997 Kimura et al. .................. 901/48
7,383,751 B2 * 6/2008 Hashimoto et al. ........ 414/744.6
(Continued)

FOREIGN PATENT DOCUMENTS

| JP | 62-144186 U | 9/1987 |
| JP | 62-213983 A | 9/1987 |

(Continued)

OTHER PUBLICATIONS

International Search Report for International Application No. PCT/JP2011/058674, mailed Jun. 14, 2011, with English translation.

(Continued)

*Primary Examiner* — Gerald McClain
(74) *Attorney, Agent, or Firm* — Cantor Colburn LLP

(57) ABSTRACT

An industrial robot may include a main body section, a first arm, a second arm, a third arm, a first speed reducer which connects the main body section and the first arm, a second speed reducer which connects the first arm and the second arm, and a connecting mechanism which connects the input shaft of the first speed reducer and the input shaft of the second speed reducer, and a second drive motor which drives the third arm. The speed reduction ratio of the first and second speed reducer are set such that the movement loci of a third articulation section which connects the second and third arm are rectilinear. The connecting mechanism connects the input shafts at a predetermined speed ratio. The second drive motor is mounted on the second arm closer to the tip than where a third articulation section is located.

7 Claims, 8 Drawing Sheets

(56) References Cited

U.S. PATENT DOCUMENTS

| | | | |
|---|---|---|---|
| 8,136,422 B2* | 3/2012 | Kitahara et al. | 414/744.5 |
| 2005/0193854 A1* | 9/2005 | Sanemasa | 74/490.02 |
| 2011/0262257 A1* | 10/2011 | Hino | 414/744.5 |

FOREIGN PATENT DOCUMENTS

| | | |
|---|---|---|
| JP | 2-4781 U | 1/1990 |
| JP | 11-163090 A | 6/1999 |
| JP | 2001-310287 A | 11/2001 |
| JP | 2007-152490 A | 6/2007 |
| WO | WO 2006109791 A1 * | 10/2006 |

OTHER PUBLICATIONS

International Preliminary Report on Patentability corresponding to International Application No. PCT/JP2011/058674; Date of Issuance: Dec. 10, 2012.

Written Opinion of the International Searching Authority corresponding to International Application No. PCT/JP2011/058674; Date of Mailing: Jun. 14, 2011.

* cited by examiner

INDUSTRIAL ROBOT WITH PROTRUDING SECOND DRIVE MOTOR

CROSS REFERENCE TO RELATED APPLICATIONS

This is a U.S. national stage of International Application No. PCT/JP2011/058674, filed on Apr. 6, 2011. Priority under 35 U.S.C. §119(a) and 35 U.S.C. §365(b) is claimed from Japanese Application No. 2010-104066, filed Apr. 28, 2010, the disclosures of which are also incorporated herein by reference.

TECHNICAL FIELD

The present invention relates to an articulated type industrial robot provided with a plurality of joint parts.

BACKGROUND

Conventionally, an industrial robot for carrying a workpiece such as a semiconductor wafer has been known which is structured of a base, a link mechanism, an arm part and a hand part (see, for example, Patent Literature 1). In the industrial robot described in Patent Literature 1, the link mechanism is provided with a base side link part which is turnably attached to the base and an arm side link part which is turnably attached to the base side link part.

The base side link part is turnably held by a link mechanism motor which is incorporated into the base. Further, the base side link part is incorporated with a base side pulley which is fixed to the base, an arm part side pulley which is fixed to the arm side link part, and a belt which is stretched over the base side pulley and the arm part side pulley. The base side pulley and the arm part side pulley of the industrial robot are formed so that the ratio of their diameters is set to be 2:1 and, when the link mechanism motor is rotated, a tip end side of the arm side link part performs a linear operation.

Further, in the industrial robot, the arm part is turnably attached to a tip end side of the arm side link part. The arm part is connected with an arm part motor which is incorporated into the arm side link part. The arm part motor is incorporated into the arm side link part with an upper and lower direction as a direction of its turning shaft.

[PTL 1] Japanese Patent Laid-Open No. 2007-152490

In the industrial robot described in Patent Literature 1, the ratio of the diameter of the base side pulley to the diameter of the arm part side pulley is set to be 2:1. Further, loads of the arm side link part, the arm part and the hand part are applied to the belt which is stretched over the base side pulley and the arm part side pulley. Therefore, the sizes of the base side pulley, the arm part side pulley and the belt which are disposed in the inside of the base side link part tend to be increased. Accordingly, in the industrial robot, the size of the base side link part tends to be increased and, as a result, the industrial robot tends to be enlarged.

Further, in the industrial robot, the arm part motor is incorporated into the arm side link part with the upper and lower direction as a direction of its turning shaft and thus the thickness of the arm side link part is increased. Therefore, in the industrial robot, the height of the hand part tends to be increased and the minimum height (pass line) that the robot is accessible may be increased.

SUMMARY

In view of the problem described above, at least an embodiment of the present invention provides an industrial robot whose size is capable of being reduced and whose pass line is capable of being lowered.

In order to attain the above, at least an embodiment of the present invention provides an industrial robot including a main body part, a first arm whose base end side is turnably attached to the main body part, a second arm whose base end side is turnably attached to a tip end side of the first arm, a tip end side operation part whose base end side is turnably attached to a tip end side of the second arm, a first speed reducer structuring a first joint part which connects the main body part with the first arm, a second speed reducer structuring a second joint part which connects the first arm with the second arm, a third joint part which connects the second arm with the tip end side operation part, a connecting mechanism which connects a first input shaft that is an input shaft of the first speed reducer with a second input shaft that is an input shaft of the second speed reducer, the connecting mechanism being disposed in an inside of the first arm, a first drive motor which is connected with the first input shaft, and a second drive motor which drives to turn the tip end side operation part. A reduction ratio of the first speed reducer and a reduction ratio of the second speed reducer are set so that a moving trace of the third joint part is formed in a straight line shape, and the connecting mechanism connects the first input shaft with the second input shaft in a predetermined speed ratio, and the second drive motor is attached to the second arm on a tip end side with respect to the third joint part so as to protrude to the first arm side.

In the industrial robot in accordance with at least an embodiment of the present invention, the second drive motor is attached to the second arm on a tip end side with respect to the third joint part so as to protrude to the first arm side. Therefore, in comparison with a case that the second drive motor is incorporated in the second arm between the second joint part and the third joint part, the thickness of the second arm can be reduced. Therefore, according to at least an embodiment of the present invention, the pass line of the industrial robot can be lowered.

Further, in at least an embodiment of the present invention, the connecting mechanism connects the first input shaft which is an input shaft of the first speed reducer with the second input shaft which is an input shaft of the second speed reducer. Therefore, a load applied to the connecting mechanism can be reduced. Accordingly, the size of the connecting mechanism which is disposed in the inside of the first arm is reduced and the size of the first arm can be reduced. Further, since the size of the first arm can be reduced, even when the second drive motor is attached to the second arm so as to protrude to the first arm side, interference of the first arm with the second drive motor is prevented without enlarging the size of the second arm. In other words, in at least an embodiment of the present invention, even when the second drive motor is attached to the second arm so as to protrude to the first arm side, the size of the second arm can be reduced while preventing interference of the first arm with the second drive motor. As described above, according to at least an embodiment of the present invention, the sizes of the first arm and the second arm can be reduced. Further, according to the present invention, as described above, the thickness of the second arm can be reduced. Therefore, according to at least an embodiment of the present invention, the size of the industrial robot can be reduced.

Further, according to at least an embodiment of the present invention, the first joint part is structured of the first speed reducer and the second joint part is structured of the second speed reducer and thus the rigidities of the first joint part and the second joint part can be increased.

In at least an embodiment of the present invention, it is preferable that the industrial robot includes a hollow shaft which is formed in a hollow shape and which is disposed so as to pass through a center of the first speed reducer and/or a center of the second speed reducer, and the first input shaft and/or the second input shaft are turnably disposed on an outer peripheral side of the hollow shaft. According to this structure, even when the first joint part and the second joint part are structured of a speed reducer, wiring lines of the industrial robot can be passed by using the inner peripheral side of the hollow shaft in the first joint part and the second joint part. In other words, even when a space for passing the wiring lines is not provided on an outer peripheral side of the speed reducer in the first joint part and the second joint part, the wiring lines of the industrial robot can be passed. Therefore, the diameters of the first joint part and/or the second joint part can be made small and thus the size of the industrial robot can be reduced.

In at least an embodiment of the present invention, it is preferable that the third joint part is structured of a third speed reducer. According to this structure, rigidity of the third joint part can be increased.

In at least an embodiment of the present invention, it is preferable that the industrial robot includes a second hollow shaft which is formed in a hollow shape and is disposed so as to pass through a center of the third speed reducer, and a third input shaft which is an input shaft of the third speed reducer is turnably disposed on an outer peripheral side of the second hollow shaft. According to this structure, even when the third joint part is structured of a speed reducer, the wiring lines of the industrial robot can be passed by using an inner peripheral side of the second hollow shaft in the third joint part. In other words, even when a space for passing the wiring lines is not provided on an outer peripheral side of the speed reducer in the third joint part, the wiring lines of the industrial robot can be passed. Therefore, the diameter of the third joint part can be made small and thus the size of the industrial robot can be reduced.

In at least an embodiment of the present invention, for example, the connecting mechanism includes a first pulley which is fixed to the first input shaft, a second pulley which is fixed to the second input shaft, and a belt which is stretched over the first pulley and the second pulley.

In at least an embodiment of the present invention, it is preferable that the tip end side operation part includes a third arm whose base end side is turnably attached to a tip end side of the second arm, a hand whose base end side is turnably attached to a tip end side of the third arm, and a hand drive mechanism which drives to turn the hand. The hand drive mechanism includes a hand drive motor, a hand speed reducer which is attached to an output shaft of the hand drive motor, and a hand pulley which is attached to the hand speed reducer and, in addition, the hand pulley is formed in a substantially tube-like shape and is attached to the hand speed reducer so as to cover a part of an outer peripheral face of a main body of the hand drive motor. According to this structure, the hand pulley is attached to a hand speed reducer so as to cover a part of an outer peripheral face of the main body of the hand drive motor and thus the height of the hand drive mechanism is lowered and the pass line of the industrial robot can be lowered.

In at least an embodiment of the present invention, it is preferable that the hand speed reducer is attached to an output shaft of the hand drive motor so as to cover an outer peripheral face of the output shaft of the hand drive motor. According to this structure, the height of the hand drive mechanism is further lowered and the pass line of the industrial robot can be further lowered.

In at least an embodiment of the present invention, it is preferable that the tip end side operation part includes a first hand and a second hand as the hand which are disposed so as to superpose on each other in an upper and lower direction, and a first hand drive mechanism which drives to turn the first hand and a second hand drive mechanism which drives to turn the second hand as the hand drive mechanism. The first hand drive mechanism includes a first hand drive motor as the hand drive motor, a first hand speed reducer as the hand speed reducer, and a first hand pulley as the hand pulley, and the second hand drive mechanism includes a second hand drive motor as the hand drive motor, a second hand speed reducer as the hand speed reducer, and a second hand pulley as the hand pulley. The first hand drive motor and the second hand drive motor are disposed at substantially the same height, the first hand speed reducer and the second hand speed reducer are disposed at substantially the same height, and the first hand pulley and the second hand pulley are disposed at positions which are displaced from each other in the upper and lower direction. According to this structure, even when the tip end side operation part includes two hands, the height of the hand drive mechanism is lowered and the pass line of the industrial robot can be lowered.

As described above, in the industrial robot in accordance with at least an embodiment of the present invention, its size is capable of being reduced and its pass line is capable of being lowered.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which.

DESCRIPTION OF EMBODIMENTS

Embodiments of the present invention will be described below with reference to the accompanying drawings.

(Schematic Structure of Industrial Robot)

Figure 1:
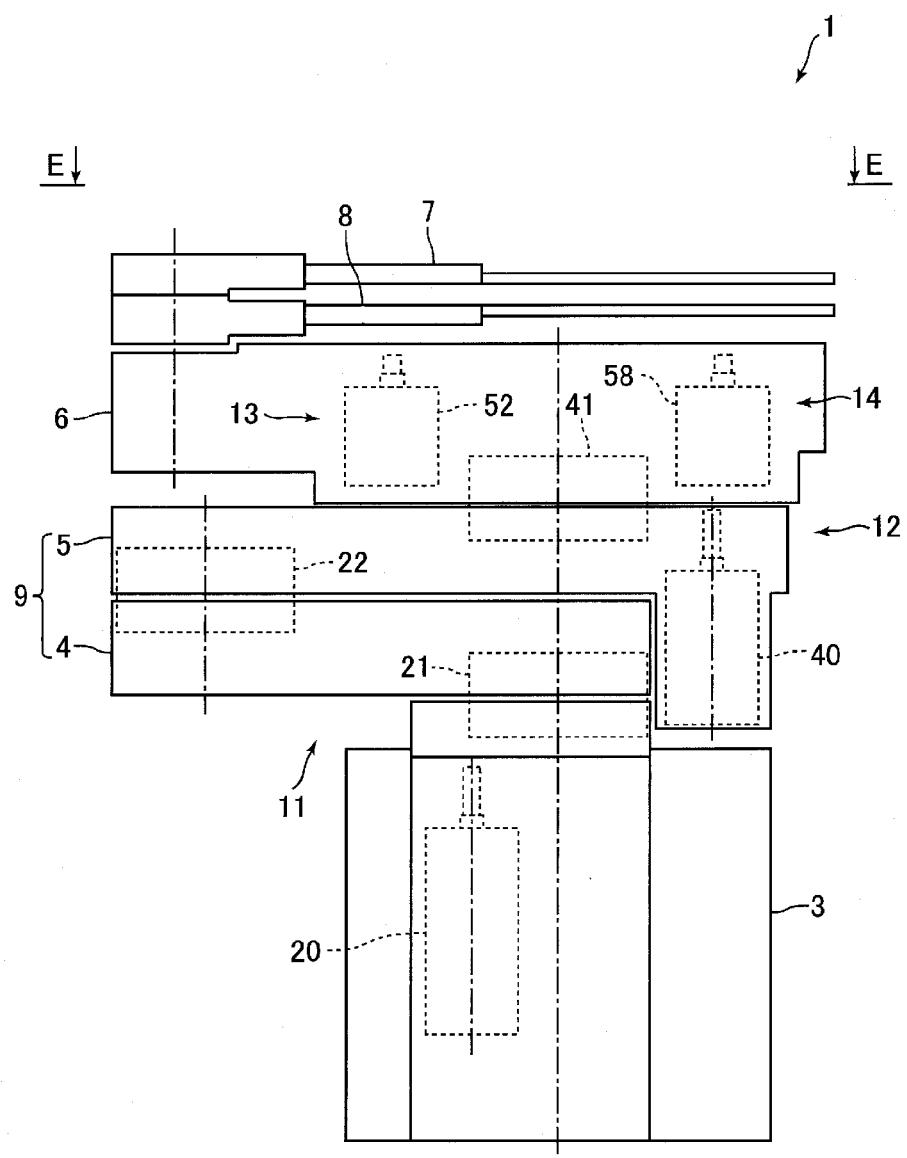
FIG. 1 is a schematic side view showing an industrial robot in accordance with an embodiment of the present invention.
Figure 2:
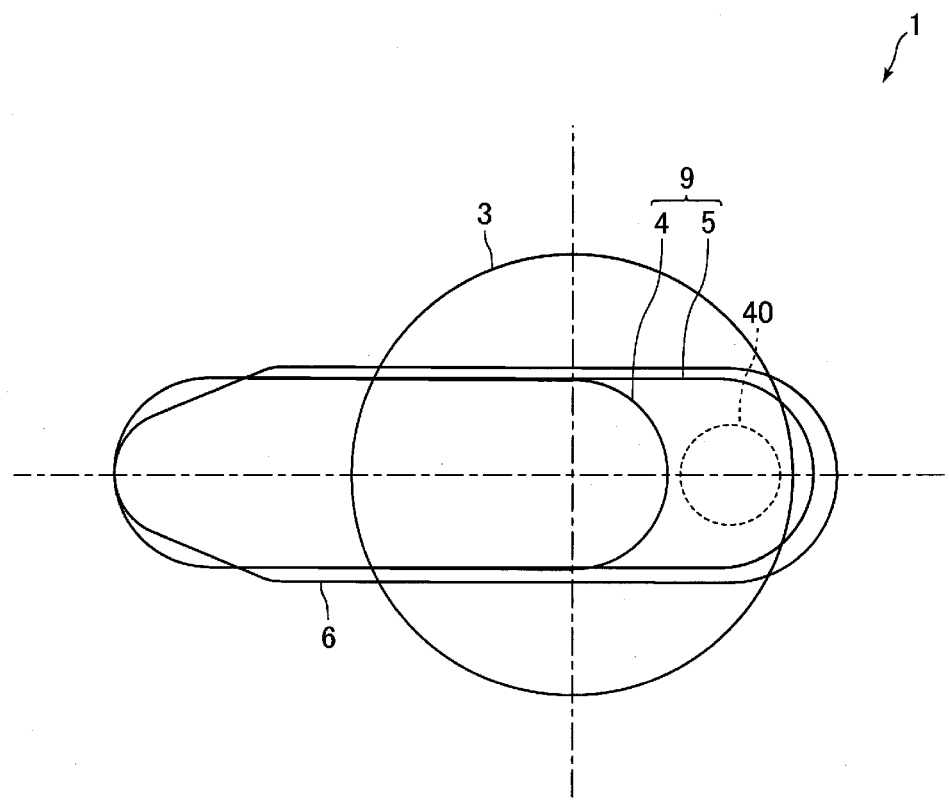
FIG. 2 is a schematic plan view showing the industrial robot which is viewed in the "E-E" direction in FIG. 1.
Figure 3:
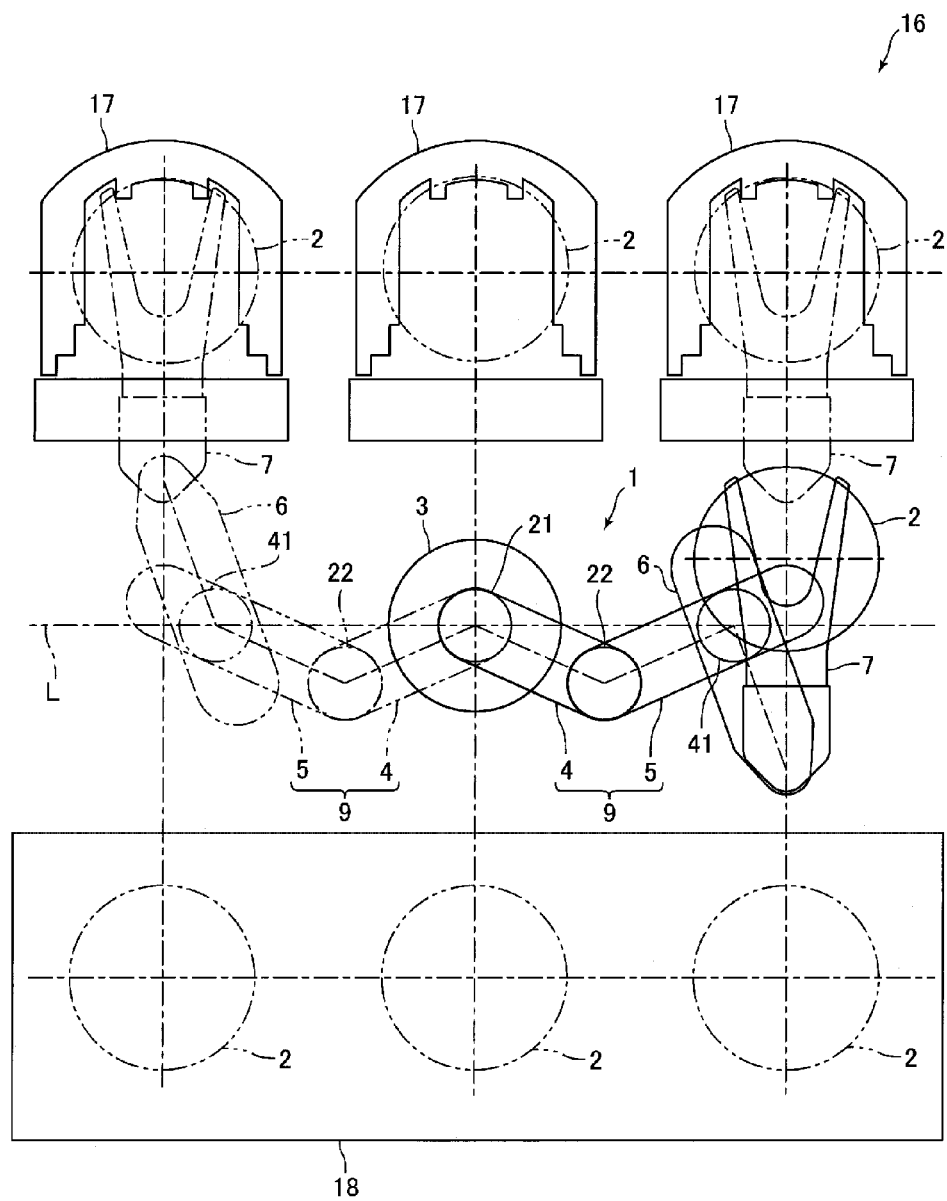
FIG. 3 is a schematic plan view showing a semiconductor manufacturing system in which the industrial robot shown in FIG. 1 is used.

FIG. 1 is a schematic side view showing an industrial robot 1 in accordance with an embodiment of the present invention. FIG. 2 is a schematic plan view showing the industrial robot 1 which is viewed in the "E-E" direction in FIG. 1. FIG. 3 is a schematic plan view showing a semiconductor manufacturing system 16 in which the industrial robot 1 shown in FIG. 1 is used. In FIG. 2, hands 7 and 8 are not shown.

The industrial robot 1 in this embodiment is an articulated type robot for carrying a semiconductor wafer 2 (see FIG. 3). The industrial robot 1 includes, as shown in FIG. 1, a main body part 3, a first arm 4 turnably attached to the main body part 3, a second arm 5 turnably attached to the first arm 4, a third arm 6 turnably attached to the second arm 5, and hands 7 and 8 turnably attached to the third arm 6. In the following descriptions, the industrial robot 1 is referred to as a "robot 1" and the semiconductor wafer 2 is referred to as a "wafer 2".

The robot 1 includes an arm part drive mechanism 11 which turns the first arm 4 and the second arm 5 to expand and contract the arm part 9 which is comprised of the first arm 4 and the second arm 5, a third arm drive mechanism 12 which drives to turn the third arm 6, a hand drive mechanism 13 which drives to turn the hand 7, and a hand drive mechanism 14 which drives to turn the hand 8.

As shown in FIG. 3, for example, the robot 1 is incorporated and used in a semiconductor manufacturing system 16. Specifically, the robot 1 is disposed in an inlet port of the semiconductor manufacturing system 16 to take out a wafer 2 accommodated in a cassette 17 and to accommodate the wafer 2 in an inside of the processing device 18.

The main body part 3 is formed in a cylindrical tube shape. An elevating/lowering mechanism (not shown) for elevating and lowering the first arm 4 is accommodated in the inside of the main body part 3. The first arm 4, the second arm 5 and the third arm 6 are formed in a hollow shape. A base end side of the first arm 4 is turnably attached to the main body part 3. A base end side of the second arm 5 is turnably attached to a tip end side of the first arm 4. A base end side of the third arm 6 is turnably attached to a tip end side of the second arm 5. In this embodiment, in the upper and lower direction, the main body part 3, the first arm 4, the second arm 5 and the third arm 6 are disposed in this order from the lower side.

The hand 7 is, as shown in FIG. 3, formed in a roughly "Y" shape when viewed in the upper and lower direction and a wafer 2 is mounted on a tip end part of the hand 7 formed in a two-forked shape. The hand 8 is formed in a similar shape to the hand 7 and a wafer 2 is mounted on a tip end part of the hand 8 formed in a two-forked shape.

Base end sides of the hands 7 and 8 are turnably attached to a tip end side of the third arm 6. The hands 7 and 8 are disposed so as to superpose on each other in the upper and lower direction. Specifically, the hand 7 is disposed on an upper side and the hand 8 is disposed on a lower side. Further, the hands 7 and 8 are disposed on an upper side with respect to the third arm 6. In this embodiment, for example, the hand 7 is a first hand and the hand 8 is a second hand. Further, in this embodiment, a tip end side operation part whose base end side is turnably attached to a tip end side of the second arm 5 is structured of the third arm 6 and the hands 7 and 8.

In FIG. 3, the hand 8 is not shown. Further, at the time of operation of the robot 1 in this embodiment, there may be a case that the hand 7 and the hand 8 are superposed on each other in the upper and lower direction but, in most cases, the hand 7 and the hand 8 are not superposed on each other in the upper and lower direction. For example, as shown by the two-dot chain line in FIG. 3, when the hand 7 is entered into the inside of a cassette 17, the hand 8 is turned to a main body part 3 side and is not entered into the cassette 17. In this case, a turning angle of the hand 8 with respect to the hand 7 is, for example, set to be 120° through 150°.

(Structure of Arm Part Drive Mechanism)

Figure 4:
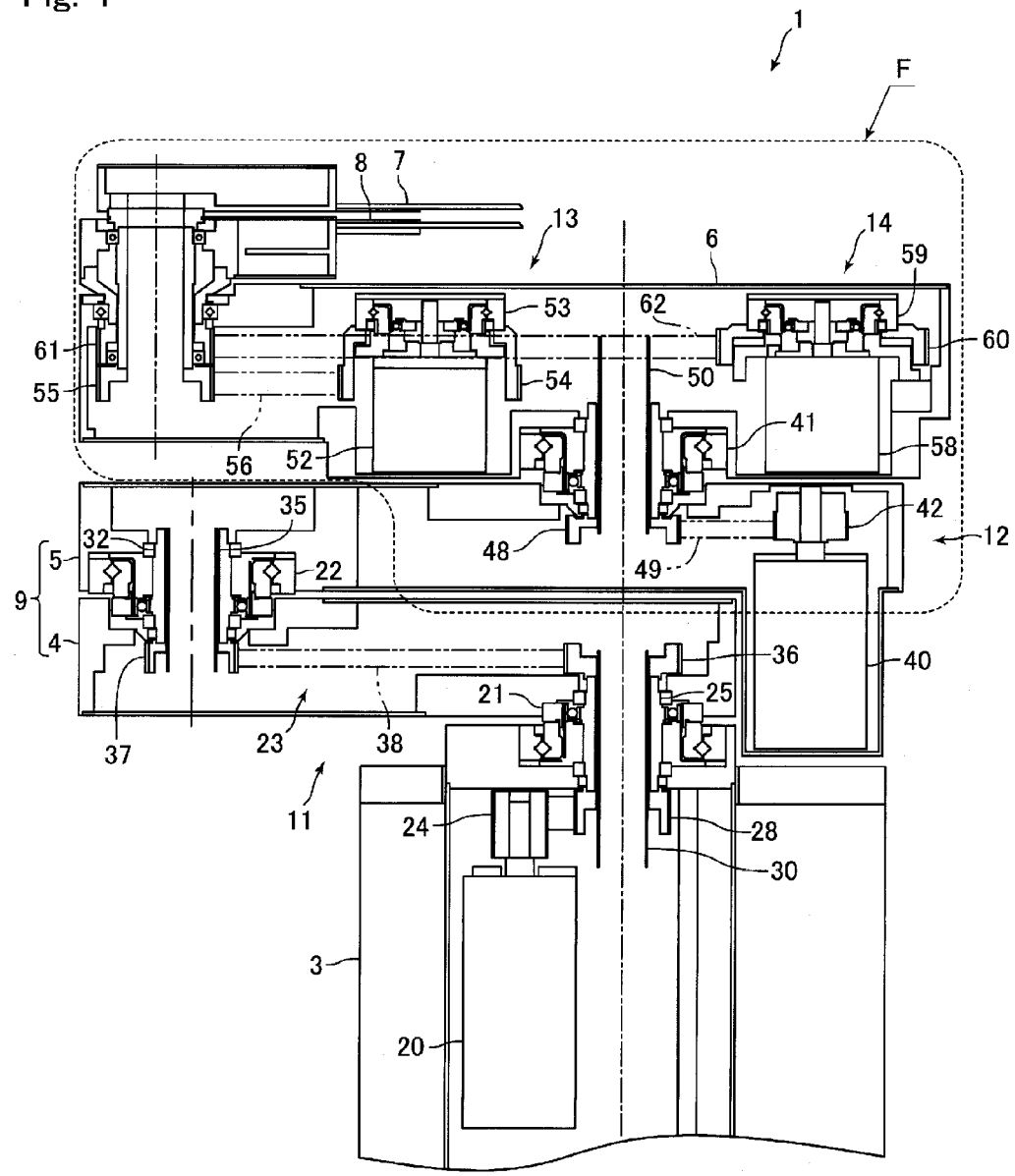
FIG. 4 is a cross-sectional view showing an internal structure of the industrial robot in FIG. 1.
Figure 5:
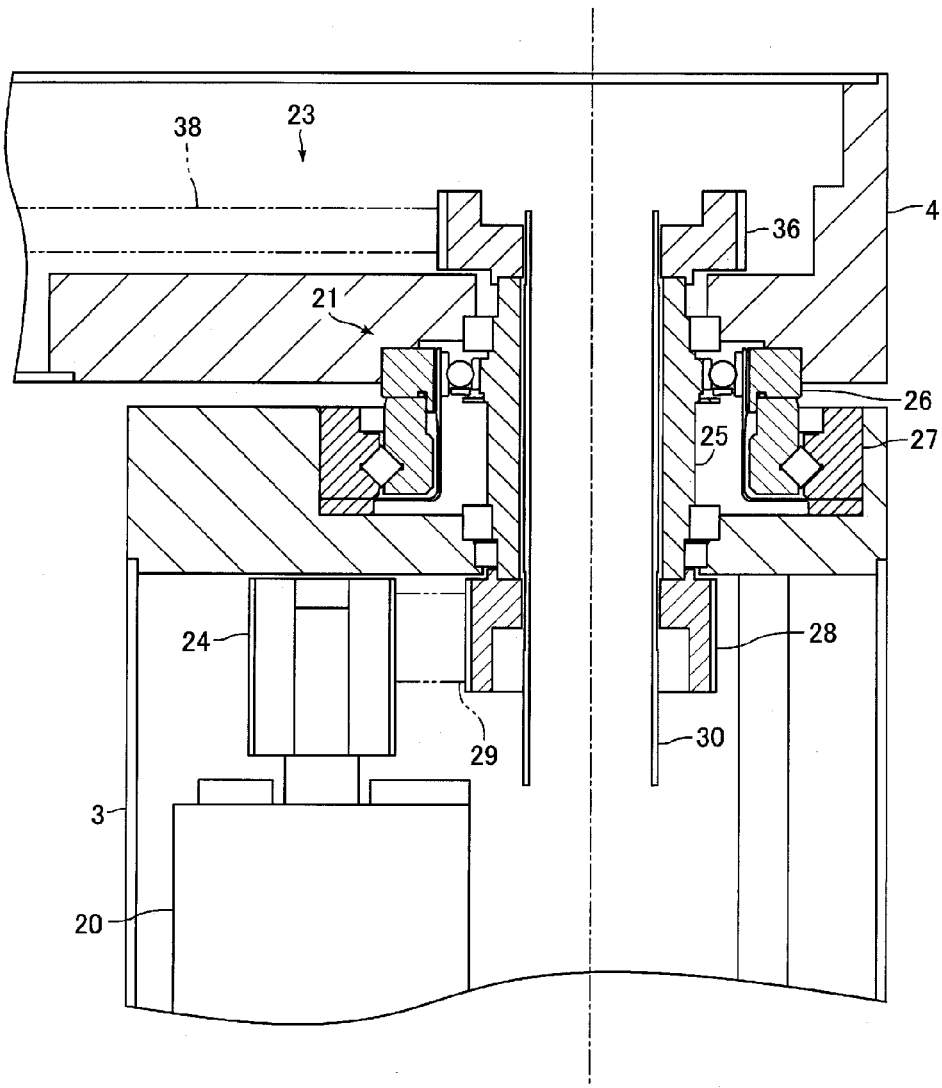
FIG. 5 is an enlarged cross-sectional view showing a structure of a first speed reducer and its surrounding portion shown in FIG. 4.
Figure 6:
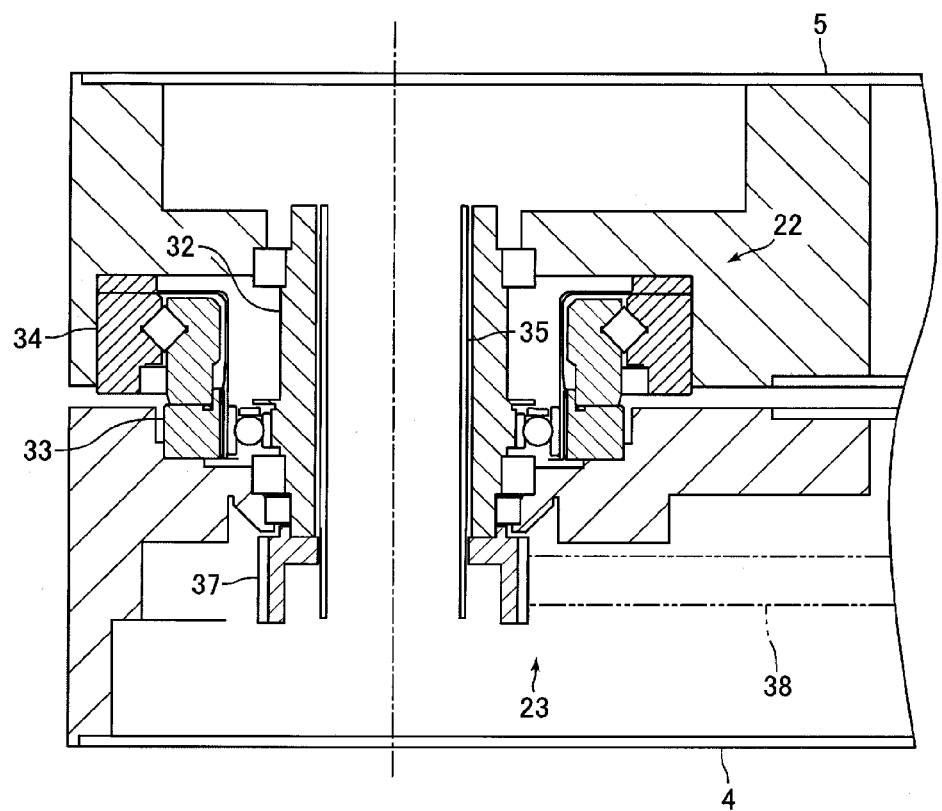
FIG. 6 is an enlarged cross-sectional view showing a structure of a second speed reducer and its surrounding portion shown in FIG. 4.

FIG. 4 is a cross-sectional view showing an internal structure of the industrial robot 1 in FIG. 1. FIG. 5 is an enlarged cross-sectional view showing a structure of a first speed reducer 21 and its surrounding portion shown in FIG. 4. FIG. 6 is an enlarged cross-sectional view showing a structure of a second speed reducer 22 and its surrounding portion shown in FIG. 4.

The arm part drive mechanism 11 includes a first drive motor 20 which is a drive source, a first joint part comprising a first speed reducer 21 which decelerates power of the first drive motor 20 to transmit the power to the first arm 4, a second joint part comprising a second speed reducer 22 which decelerates power of the first drive motor 20 to transmit the power to the second arm 5, and a connecting mechanism 23 which connects the first speed reducer 21 with the second speed reducer 22.

The first drive motor 20 is disposed in the inside of the main body part 3. A pulley 24 is fixed to an output shaft of the first drive motor 20.

The first speed reducer 21 connects the main body part 3 with the first arm 4. The first speed reducer 21 is, for example, a harmonic drive (registered mark) which is a wave motion gear device. As shown in FIG. 5, the first speed reducer 21 is structured of a wave generator 25, a circular spline 26 and a flexspline 27. The flexspline 27 is fixed to the main body part 3. The circular spline 26 is fixed to a base end side of the first arm 4. A pulley 28 is fixed to a lower end of the wave generator 25. A belt 29 is stretched over the pulley 28 and the pulley 24 fixed to an output shaft of the first drive motor 20.

A base end side of the first arm 4 is fixed with a hollow shaft 30 which is disposed so as to pass through a center of the first speed reducer 21. The wave generator 25 is turnably disposed on an outer peripheral side of the hollow shaft 30. In this embodiment, predetermined wiring lines are passed by utilizing an inner peripheral side of the hollow shaft 30.

The second speed reducer 22 connects the first arm 4 with the second arm 5. The second speed reducer 22 is a harmonic drive (registered mark) having a similar shape to the first speed reducer 21. As shown in FIG. 6, the second speed reducer 22 is structured of a wave generator 32, a circular spline 33 and a flexspline 34. The flexspline 34 is fixed to a base end side of the second arm 5. The circular spline 33 is fixed to a tip end side of the first arm 4.

A tip end side of the first arm 4 is fixed with a hollow shaft 35 which is disposed so as to pass through a center of the second speed reducer 22. The wave generator 32 is turnably disposed on an outer peripheral side of the hollow shaft 35. In this embodiment, predetermined wiring lines are passed by utilizing an inner peripheral side of the hollow shaft 35.

The connecting mechanism 23 includes a pulley 36 which is fixed to an upper end of the wave generator 25, a pulley 37 which is fixed to a lower end of the wave generator 32, and a belt 38 which is stretched over the pulleys 36 and 37. The pulleys 36 and 37 and the belt 38 are disposed in the inside of the first arm 4.

The pulley 28 fixed to the lower end of the wave generator 25 is connected with the output shaft of the first drive motor 20 through the belt 29 as described above and thus, the wave generator 25 in this embodiment is a first input shaft which is an input shaft of the first speed reducer 21. Further, the wave generator 32 is connected with the output shaft of the first drive motor 20 through the wave generator 25, the belts 29 and 38 and the pulleys 28, 36 and 37 and thus, the wave generator 32 in this embodiment is a second input shaft which is an input shaft of the second speed reducer 22. Further, the pulley 36 is a first pulley fixed to the wave generator 25 which is the first input shaft and the pulley 37 is the second pulley fixed to the wave generator 32 which is the second input shaft.

In this embodiment, the first speed reducer 21 and the second speed reducer 22 are a speed reducer having the same shape as each other but their reduction ratios are different from each other. Further, in this embodiment, the reduction ratio of the first speed reducer 21, the reduction ratio of the second speed reducer 22, and the ratio of a diameter of the pulley 36 to a diameter of the pulley 37 are set so that a moving trace of the center of a third joint part comprising a third speed reducer 41 described below connecting the second arm 5 with the third arm 6 is formed in a linear shape. In other words, the connecting mechanism 23 connects the wave generators 25 and 32 with each other with a predetermined speed ratio in consideration of the reduction ratios of the first speed reducer 21 and the second speed reducer 22 so that the moving trace of the center of the third speed reducer 41 is formed in a straight line shape. Specifically, a ratio between a diameter of the pulley 36 and a diameter of the pulley 37 is set so that, when viewed in the upper and lower direction, a moving trace of the center of the third speed reducer 41 at the time of expanding and contracting of the arm part 9 is formed in a straight line "L" (see FIGS. 2 and 3) which passes the center of the first speed reducer 21.

(Structure of Third Arm Drive Mechanism)

Figure 7:
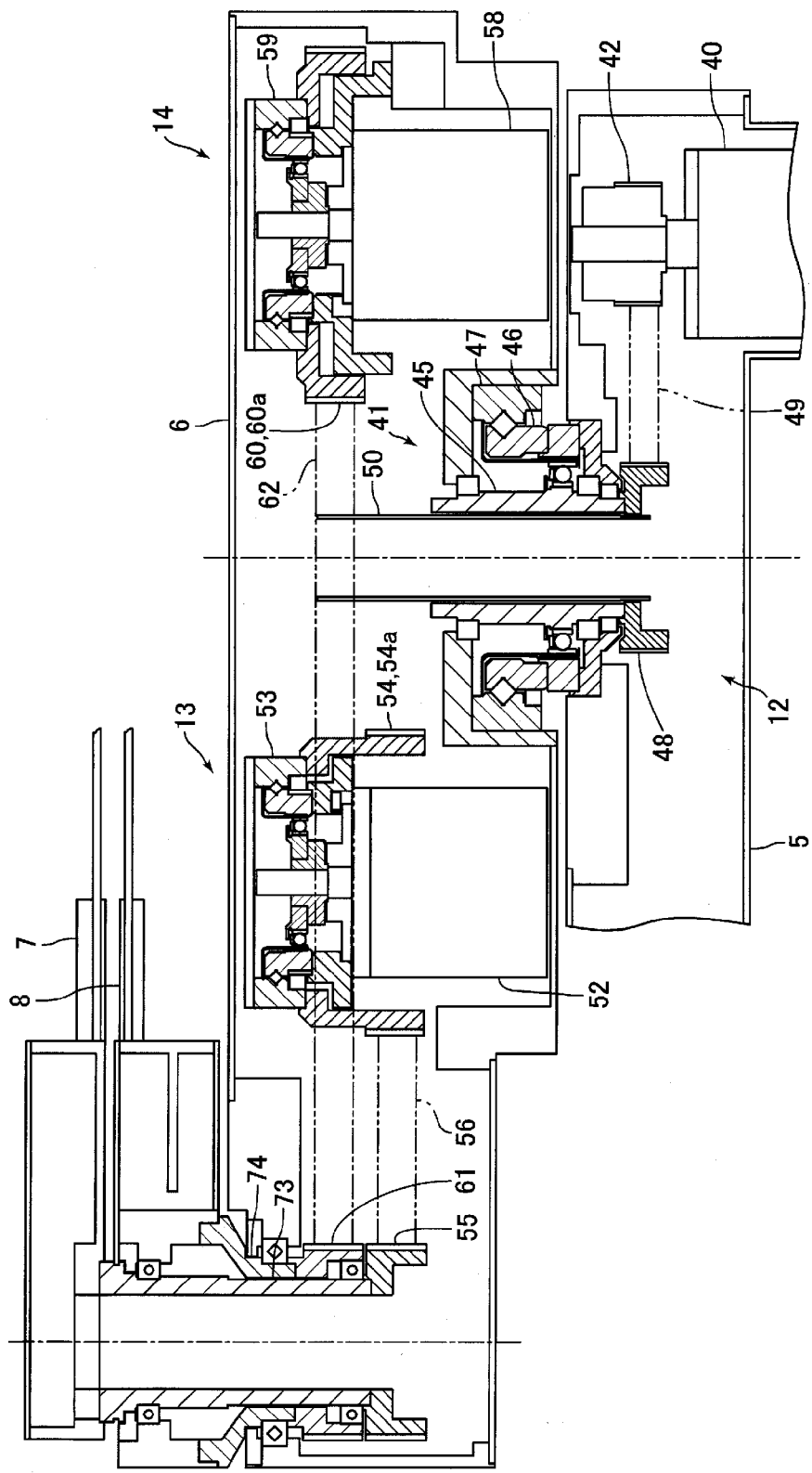
FIG. 7 is an enlarged view showing the "F" part in FIG. 4.

FIG. 7 is an enlarged view showing the "F" part in FIG. 4. The third arm part drive mechanism 12 includes a second drive motor 40 which is a drive source and a third speed reducer 41 which decelerates power of the second drive motor 40 to transmit the power to the third arm 6.

The second drive motor 40 is attached to a tip end side of the second arm 5. Specifically, the second drive motor 40 is fixed on a tip end side with respect to a portion of the second arm 5 at which the third speed reducer 41 is disposed. The second drive motor 40 is fixed to a tip end side of the second arm 5 and, as shown in FIG. 4, a main body of the second drive motor 40 is protruded to a first arm 4 side (in other words, lower side) with respect to an under face of the second arm 5. A pulley 42 is fixed to an output shaft of the second drive motor 40. A main body portion of the second drive motor 40 protruded to a lower side with respect to the under face of the second arm 5 is covered by a cover.

Further, the second drive motor 40 is fixed to the tip end side of the second arm 5 so that, when the arm part 9 is contracted (in a state shown in FIGS. 2 and 4 and the like), the main body of the second drive motor 40 is disposed on a side with respect to the base end side of the first arm 4 and is not interfered with the first arm 4. Further, as shown in FIG. 2, the second drive motor 40 is fixed to a tip end side of the second arm 5 so that, when the arm part 9 is contracted, the second drive motor 40 is not protruded to an outer side in a radial direction with respect to an outer peripheral face of the main body part 3.

The third speed reducer 41 structures a third joint part which connects the second arm 5 with the third arm 6. The third speed reducer 41 is a harmonic drive (registered mark) and, as shown in FIG. 7, the third speed reducer 41 is structured of a wave generator 45, a circular spline 46 and a flexspline 47. The flexspline 47 is fixed to the third arm 6. The circular spline 46 is fixed to a tip end side of the second arm 5. A pulley 48 is fixed to a lower end of the wave generator 45. A belt 49 is stretched over the pulley 48 and a pulley 42 which is fixed to the output shaft of the second drive motor 40. As described above, the pulley 48 is connected with the output shaft of the second drive motor 40 through the belt 49 and thus the wave generator 45 in this embodiment is a third input shaft which is an input shaft of the third speed reducer 41.

A tip end side of the second arm 5 is fixed with a hollow shaft 50 as a second hollow shaft which is disposed so as to pass through a center of the third speed reducer 41. The wave generator 45 is turnably disposed on an outer peripheral side of the hollow shaft 50. In this embodiment, predetermined wiring lines are passed by utilizing an inner peripheral side of the hollow shaft 50.

(Structure of Hand Drive Mechanism)

Figure 8:
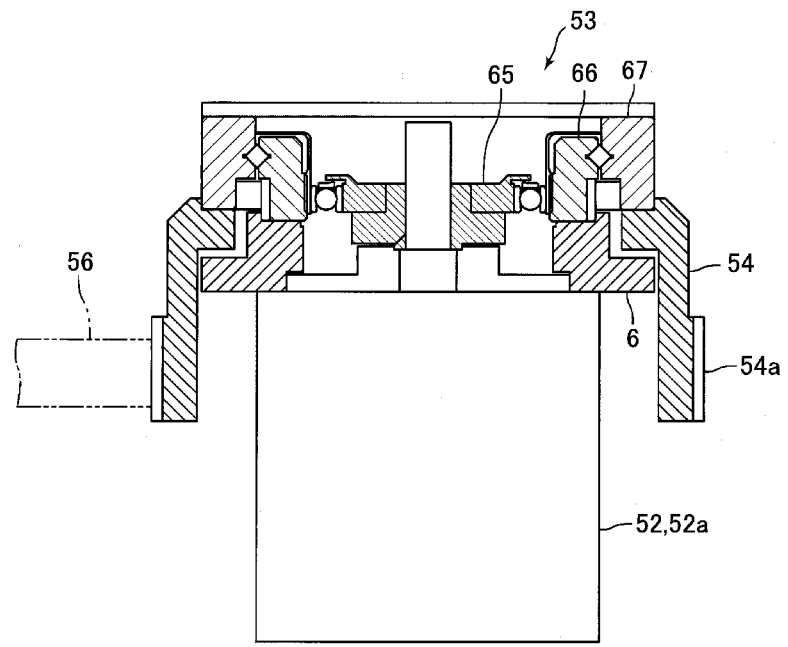
FIG. 8 is an enlarged cross-sectional view showing a structure of a first hand drive motor and its surrounding portion shown in FIG. 7.
Figure 9:
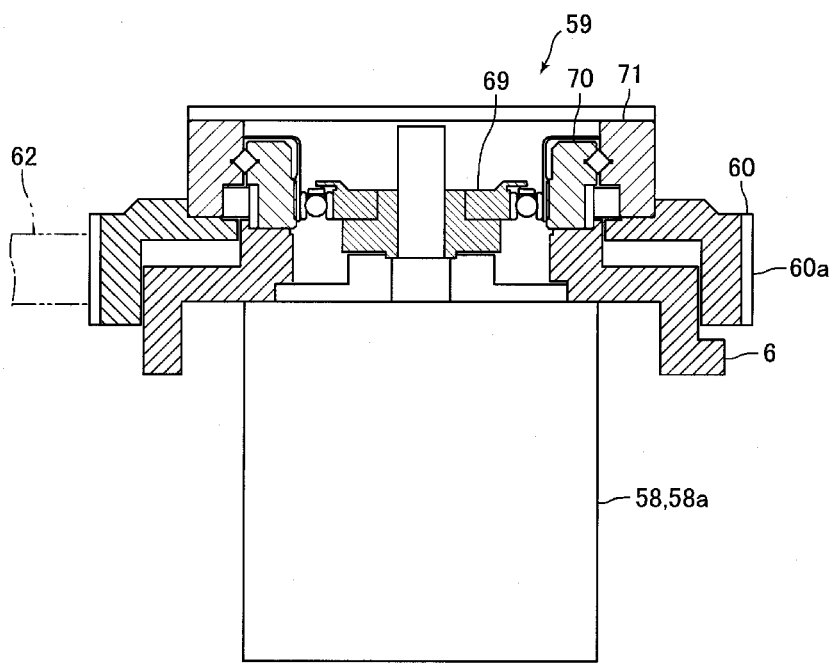
FIG. 9 is an enlarged cross-sectional view showing a structure of a second hand drive motor and its surrounding portion shown in FIG. 7.

FIG. 8 is an enlarged cross-sectional view showing a structure of a hand drive motor 52 and its surrounding portion shown in FIG. 7. FIG. 9 is an enlarged cross-sectional view showing a structure of a hand drive motor 58 and its surrounding portion shown in FIG. 7.

The hand drive mechanism 13 includes a hand drive motor 52 which is a drive source, a hand speed reducer 53 which decelerates power of the hand drive motor 52 to transmit the power to the hand 7, a pulley 54 attached to the hand speed reducer 53, a pulley 55 attached to the hand 7, and a belt 56 stretched over the pulleys 54 and 55. As shown in FIG. 7, the hand drive motor 52, the hand speed reducer 53, the pulleys 54 and 55 and the belt 56 are disposed in the inside of the third arm 6.

The hand drive mechanism 14 includes, similarly to the hand drive mechanism 13, a hand drive motor 58 which is a drive source, a hand speed reducer 59 which decelerates power of the hand drive motor 58 to transmit the power to the hand 8, a pulley 60 attached to the hand speed reducer 59, a pulley 61 attached to the hand 8, and a belt 62 which is stretched over the pulleys 60 and 61. As shown in FIG. 7, the hand drive motor 58, the hand speed reducer 59, the pulleys 60 and 61 and the belt 62 are disposed in the inside of the third arm 6.

The hand drive motors 52 and 58 are a motor having the same structure. The hand drive motors 52 and 58 are point-symmetrically disposed with respect to the center shaft of the third speed reducer 41 when viewed in the upper and lower direction. In this embodiment, the hand drive motor 52 is fixed to a tip end side of the third arm 6 with respect to the center shaft of the third speed reducer 41 and the hand drive motor 58 is fixed to a base end side of the third arm 6 with respect to the center shaft of the third speed reducer 41. Further, the hand drive motors 52 and 58 are disposed at substantially the same height.

The hand speed reducer 53 is a harmonic drive (registered mark) and, as shown in FIG. 8, the hand speed reducer 53 is structured of a wave generator 65, a circular spline 66 and a flexspline 67. The flexspline 67 is fixed with the pulley 54. The circular spline 66 is fixed to the third arm 6. The wave generator 65 is fixed to an output shaft of the hand drive motor 52. In this embodiment, a thickness of the hand speed reducer 53 is almost equal to a length of the output shaft of the hand drive motor 52 and the hand speed reducer 53 is disposed so as to cover an outer peripheral face of the output shaft of the hand drive motor 52.

The hand speed reducer 59 is a harmonic drive (registered mark) which is similar (the same shape) to the hand speed reducer 53. As shown in FIG. 9, the hand speed reducer 59 is structured of a wave generator 69, a circular spline 70 and a flexspline 71. The flexspline 71 is fixed with the pulley 60. The circular spline 70 is fixed to the third arm 6. The wave generator 69 is fixed to an output shaft of the hand drive motor 58. In this embodiment, a thickness of the hand speed reducer 59 is almost equal to a length of the output shaft of the hand drive motor 58 and the hand speed reducer 59 is disposed so as to cover an outer peripheral face of the output shaft of the hand drive motor 58. Further, in this embodiment, the hand speed reducers 53 and 59 are disposed at substantially the same height.

The pulley 54 is formed in a substantially cylindrical tube shape. As shown in FIG. 8, an upper end of the pulley 54 is fixed to a lower end of the flexspline 67 and the pulley 54 covers a part of an outer peripheral face on the upper end side of the main body 52*a* of the hand drive motor 52. An engagement part 54*a* with which the belt 56 is engaged is formed on a lower end side of the side face of the pulley 54.

The pulley 60 is formed in a substantially cylindrical tube shape whose length in the upper and lower direction is shorter than the pulley 54. As shown in FIG. 9, an upper end of the pulley 60 is fixed to a lower end of the flexspline 71 and the pulley 60 covers a part of an outer peripheral face on the upper end side of the main body 58*a* of the hand drive motor 58. An engagement part 60*a* with which the belt 62 is engaged is formed on a side face of the pulley 60.

As shown in FIG. 7, a pulley 55 is fixed to a lower end side of a hollow shaft 73 which is fixed to a base end side of the hand 7. In other words, the pulley 55 is fixed to the hand 7 through the hollow shaft 73. A pulley 61 is fixed to a lower end of a hollow shaft 74 which is fixed to a base end side of the hand 8. In other words, the pulley 61 is fixed to the hand 8 through the hollow shaft 74. The hollow shaft 74 is concentrically disposed with the hollow shaft 73 so as to cover an outer peripheral face of the hollow shaft 73 and the pulleys 55 and 61 are disposed so as to superpose on each other in the upper and lower direction. In this embodiment, the pulley 55 is disposed on a lower side and the pulley 61 is disposed on an upper side. Further, since the pulleys 55 and 61 are disposed so as to superpose on each other in the upper and lower direction, the engagement part 54*a* of the pulley 54 and the engagement part 60*a* of the pulley 60 are disposed at positions which are displaced from each other in the upper and lower direction. In this embodiment, the engagement part 54*a* is disposed on a lower side and the engagement part 60*a* is disposed on an upper side.

In this embodiment, the pulleys 54 and 60 are hand pulleys which are attached to the hand speed reducers 53 and 59. Further, the hand drive mechanism 13 is a first hand drive mechanism which drives to turn the hand 7 that is a first hand and the hand drive mechanism 14 is a second hand drive mechanism which drives to turn the hand 8 that is a second hand. In addition, the hand drive motor 52 is a first hand drive motor, the hand drive motor 58 is a second hand drive motor, the hand speed reducer 53 is a first hand speed reducer, the hand speed reducer 59 is a second hand speed reducer, the pulley 54 is a first hand pulley, and the pulley 60 is a second hand pulley.

(Schematic Operation of Industrial Robot)

In the robot 1 structured as described above, when the first drive motor 20 is driven, as shown in FIG. 3, the arm part 9 is expanded and contracted so that the center of the third speed reducer 41 is moved on the straight line "L". Further, when the second drive motor 40 is driven, the third arm 6 is relatively turned with respect to the arm part 9 with the third speed reducer 41 as a turning center. In addition, when the hand drive motor 52 is driven, the hand 7 is relatively turned with respect to the third arm 6 with the hollow shaft 73 as a turning center and, when the hand drive motor 58 is driven, the hand 8 is relatively turned with respect to the third arm 6 with the hollow shaft 74 as a turning center.

The robot 1 takes out a wafer 2 which is accommodated in the cassette 17 to accommodate the wafer 2 in the inside of the processing device 18 by combining the above-mentioned operations. When a wafer 2 is to be carried by the robot 1, the arm part 9, the third arm 6 and the hands 7 and 8 are moved up and down by an elevating/lowering mechanism disposed in the inside of the main body part 3 as needed.

Principal Effects in this Embodiment

As described above, in this embodiment, the second drive motor 40 is attached to the second arm 5 so as to protrude to the first arm 4 side on a tip end side with respect to a portion of the second arm 5 where the third speed reducer 41 is disposed. Therefore, in comparison with a case that the second drive motor 40 is incorporated into the second arm 5 between the second speed reducer 22 and the third speed reducer 41, the thickness of the second arm 5 can be reduced.

Further, in this embodiment, the pulley 54 is fixed to the hand speed reducer 53 so as to cover a part of the outer peripheral face on the upper end side of the main body 52*a* of the hand drive motor 52, and the pulley 60 is fixed to the hand speed reducer 59 so as to cover a part of the outer peripheral face on the upper end side of the main body 58*a* of the hand drive motor 58. Further, in this embodiment, the hand speed reducer 53 whose thickness is almost equal to a length of the output shaft of the hand drive motor 52 is disposed so as to cover an outer peripheral face of the output shaft of the hand drive motor 52, and the hand speed reducer 59 whose thickness is almost equal to a length of the output shaft of the hand drive motor 58 is disposed so as to cover an outer peripheral face of the output shaft of the hand drive motor 58. Therefore, even when the hand speed reducers 53 and 59 are fixed to the output shafts of the hand drive motors 52 and 58 and, even when the pulleys 54 and 60 are fixed to the hand speed reducers 53 and 59, the heights of the hand drive mechanisms 13 and 14 are reduced and the thickness of the third arm 6 can be reduced.

Especially, in this embodiment, the shape of the pulley 54 and the shape of the pulley 60 are different from each other. Therefore, even when the hand drive motors 52 and 58 are disposed at substantially the same height as each other and the hand speed reducers 53 and 59 are disposed at substantially the same height as each other, the engagement part 54*a* of the pulley 54 and the engagement part 60*a* of the pulley 60 are disposed at positions displaced from each other in the upper and lower direction. Accordingly, even when the robot 1 includes two hands 7 and 8, the thickness of the third arm 6 can be reduced.

As described above, in this embodiment, the thicknesses of the second arm 5 and the third arm 6 can be reduced. Therefore, in this embodiment, the heights to the upper faces of the hands 7 and 8 are lowered and thus the pass line of the robot 1 can be lowered.

In this embodiment, the wave generator 25 which is the input shaft of the first speed reducer 21 and the wave generator 32 which is the input shaft of the second speed reducer 22 are connected with each other through the connecting mechanism 23. Therefore, a load applied to the connecting mechanism 23 can be reduced. Accordingly, the size of the connecting mechanism 23 which is disposed in the inside of the first arm 4 is reduced and the size of the first arm 4 can be reduced.

Further, in this embodiment, since the size of the first arm 4 can be reduced, even when the main body of the second drive motor 40 is fixed to a tip end side of the second arm 5 so that the second drive motor 40 is protruded to the first arm 4 side with respect to the under face of the second arm 5, interference of the main body of the second drive motor 40 with the first arm 4 can be prevented when the arm part 9 is contracted without increasing the size of the second arm 5. In other words, in this embodiment, even when the second drive motor 40 is attached to the second arm 5 so as to protrude to the first arm 4 side, the size of the second arm 5 can be reduced while preventing interference of the main body of the second drive motor 40 with the first arm 4 when the arm part 9 is contracted.

As described above, in this embodiment, the sizes of the first arm 4 and the second arm 5 can be reduced. Further, in this embodiment, as described above, the thicknesses of the second arm 5 and the third arm 6 can be reduced. Therefore, in this embodiment, the size of the robot 1 can be reduced.

In this embodiment, the first speed reducer 21 structures a first joint part which connects the main body part 3 with the first arm 4, the second speed reducer 22 structures a second joint part which connects the first arm 4 with the second arm 5, and the third speed reducer 41 structures a third joint part which connects the second arm 5 with the third arm 6. Therefore, the rigidities of the first joint part, the second joint part and the third joint part can be increased.

In this embodiment, the wiring lines are passed by utilizing the inner peripheral sides of the hollow shaft 30 disposed so as to pass through the center of the first speed reducer 21, the hollow shaft 35 disposed so as to pass through the center of the second speed reducer 22, and the hollow shaft 50 disposed so as to pass through the center of the third speed reducer 41. Therefore, even when the first joint part, the second joint part and the third joint part are structured of a speed reducer, the wiring lines are not required to be passed on outer peripheral sides of the speed reducers in the first joint part, the second joint part and the third joint part. Accordingly, in this embodiment, the diameters of the first joint part, the second joint part and the third joint part are made small and thus the size of the robot 1 can be reduced.

Other Embodiments

Although the present invention has been shown and described with reference to a specific embodiment, various changes and modifications will be apparent to those skilled in the art from the teachings herein.

In the embodiment described above, the flexspline 27 of the first speed reducer 21 is fixed to the main body part 3 and the circular spline 26 is fixed to the base end side of the first arm 4. Further, the flexspline 34 of the second speed reducer 22 is fixed to the base end side of the second arm 5 and the circular spline 33 is fixed to the tip end side of the first arm 4. However, the present invention is not limited to this embodiment. For example, it may be structured that the circular spline 26 is fixed to the main body part 3 and the flexspline 27 is fixed to the base end side of the first arm 4, and that the circular spline 33 is fixed to the base end side of the second arm 5 and the flexspline 34 is fixed to the tip end side of the first arm 4. In other words, the first speed reducer 21 and the second speed reducer 22 may be disposed so as to be reversed in the upper and lower direction. In this case, the ratio between the diameter of the pulley 36 and the diameter of the pulley 37 is set so that a moving trace of the center of the third speed reducer 41 is formed in a straight line shape. Further, the third speed reducer 41 may be disposed so as to be reversed in the upper and lower direction.

In the embodiment described above, the first speed reducer 21, the second speed reducer 22 and the third speed reducer 41 are a harmonic drive (registered mark). However, the first speed reducer 21, the second speed reducer 22 and/or the third speed reducer 41 may be a gear device having a hollow structure other than a harmonic drive (registered mark). For example, the first speed reducer 21, the second speed reducer 22 and/or the third speed reducer 41 may be a cyclo-speed reducer (registered mark), an RV (Rotor Vector) speed reducer, or a planetary gear speed reducer. Further, the first speed reducer 21, the second speed reducer 22 and/or the third speed reducer 41 may be a speed reducer which is provided with a first hypoid gear and a second hypoid gear engaged with the first hypoid gear. Further, the first speed reducer 21, the second speed reducer 22 and/or the third speed reducer 41 may be provided with no hollow structure.

In the embodiment described above, the connecting mechanism 23 is structured of the pulleys 36 and 37 and the belt 38. However, the present invention is not limited to this embodiment. For example, the connecting mechanism 23 may be structured of a gear train. Alternatively, the connecting mechanism 23 may be structured of a sprocket and a chain.

In the embodiment described above, the tip end side operation part whose base end side is turnably attached to the tip end side of the second arm 5 is structured of the third arm 6 and the hands 7 and 8. However, the present invention is not limited to this embodiment. For example, the tip end side operation part may be structured of the hands 7 and 8. Alternatively, the tip end side operation part may be structured of a predetermined end effector.

In the embodiment described above, power of the second drive motor 40 is decelerated by the third speed reducer 41 to be transmitted to the third arm 6. However, the present invention is not limited to this embodiment. For example, instead of using the third speed reducer 41, power of the second drive motor 40 is decelerated by using a pulley and a belt or by using a sprocket and a chain to be transmitted to the third arm 6.

In the embodiment described above, two hands 7 and 8 are attached to the tip end side of the third arm 6. However, one hand may be attached to the tip end side of the third arm 6. Further, in the embodiment described above, the robot 1 is a robot for carrying a semiconductor wafer 2. However, the robot 1 may be a carrying robot for carrying another carrying object such as a glass substrate for liquid crystal or may be an industrial robot such as an assembling robot other than a carrying robot.

In the embodiment described above, the hands 7 and 8 are formed in a roughly "Y" shape when viewed in the upper and lower direction but the hands 7 and 8 may be formed in other shapes. Further, in the embodiment described above, the hands 7 and 8 are formed in the same shape but the hands 7 and 8 are not required to be formed in the same shape.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

The invention claimed is:

1. An industrial robot comprising:
   a main body part;
   a first arm, a base end side of the first arm being turnably attached to the main body part;
   a second arm, a base end side of the second arm being turnably attached to a tip end side of the first arm;
   a tip end side operation part whose base end side is turnably attached to the second arm;
   a first joint part comprising a first speed reducer which connects the main body part with the first arm;
   a second joint part comprising a second speed reducer which connects the first arm with the second arm;
   a third joint part comprising a third speed reducer which connects the second arm with the tip end side operation part;

a connecting mechanism which connects a first input shaft that is an input shaft of the first speed reducer with a second input shaft that is an input shaft of the second speed reducer, the connecting mechanism being disposed in an inside of the first arm;

a first drive motor which is connected with the first input shaft; and a second drive motor which drives to turn the tip end side operation part;

wherein a reduction ratio of the first speed reducer and a reduction ratio of the second speed reducer are set so that a moving trace of the third joint part is formed in a straight line shape;

wherein the connecting mechanism connects the first input shaft with the second input shaft in a predetermined speed ratio;

wherein the second drive motor is attached to the second arm on a tip end side of the second arm opposite to the base end of the second arm and protrudes to the first arm side of the second arm;

wherein the third joint part is connected to the second arm between the base end of the second arm and the second drive motor;

wherein, when the industrial robot is contracted, the second drive motor is provided outside the base end side of the first arm in a radial direction with respect to a rotation axis of the first joint part; and wherein, when the industrial robot is contracted, the second drive motor does not protrude to an outer side of an outer peripheral face of the main body part in the radial direction with respect to a rotation axis of the first joint part.

2. The industrial robot according to claim 1, further comprising a hollow shaft which is formed in a hollow shape and which is disposed so as to pass through a center of the first speed reducer and/or a center of the second speed reducer, wherein the first input shaft and/or the second input shaft are turnably disposed on an outer peripheral side of the hollow shaft.

3. The industrial robot according to claim 1, further comprising a second hollow shaft which is formed in a hollow shape and is disposed so as to pass through a center of the third speed reducer, wherein a third input shaft which is an input shaft of the third speed reducer is turnably disposed on an outer peripheral side of the second hollow shaft.

4. The industrial robot according to claim 1, wherein the connecting mechanism comprises a first pulley which is fixed to the first input shaft, a second pulley which is fixed to the second input shaft, and a belt which is stretched over the first pulley and the second pulley.

5. The industrial robot according to claim 1, wherein the tip end side operation part comprises:

a third arm whose base end side is turnably attached to a tip end side of the second arm;

a hand whose base end side is turnably attached to a tip end side of the third arm; and a hand drive mechanism which drives to turn the hand;

the hand drive mechanism comprises:

a hand drive motor;

a hand speed reducer which is attached to an output shaft of the hand drive motor; and a hand pulley which is attached to the hand speed reducer; and the hand pulley is formed in a substantially cylindrical shape and is attached to the hand speed reducer so as to cover a part of an outer peripheral face of a main body of the hand drive motor.

6. The industrial robot according to claim 5, wherein the hand speed reducer is attached to an output shaft of the hand drive motor so as to cover outer peripheral face of the output shaft of the hand drive motor.

7. The industrial robot according to claim 5, wherein the tip end side operation part comprises:

a first hand and a second hand as the hand which are disposed so as to superpose on each other in an upper and lower direction; and a first hand drive mechanism which drives to turn the first hand and a second hand drive mechanism which drives to turn the second hand as the hand drive mechanism;

the first hand drive mechanism comprises:

a first hand drive motor as the hand drive motor;

a first hand speed reducer as the hand speed reducer; and a first hand pulley as the hand pulley; and the second hand drive mechanism comprises:

a second hand drive motor as the hand drive motor;

a second hand speed reducer as the hand speed reducer; and a second hand pulley as the hand pulley;

the first hand drive motor and the second hand drive motor are disposed at substantially the same height, the first hand speed reducer and the second hand speed reducer are disposed at substantially the same height, and the first hand pulley and the second hand pulley are disposed at positions which are displaced from each other in the upper and lower direction.

* * * * *